US006586979B2

(12) United States Patent
Gomm et al.

(10) Patent No.: US 6,586,979 B2
(45) Date of Patent: Jul. 1, 2003

(54) METHOD FOR NOISE AND POWER REDUCTION FOR DIGITAL DELAY LINES

(75) Inventors: Tyler J. Gomm, Meridian, ID (US); Travis E. Dirkes, Bozeman, MT (US); Ross E. Dermott, Bozeman, MT (US); Daniel R. Loughmiller, Boise, ID (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/815,465

(22) Filed: Mar. 23, 2001

(65) Prior Publication Data

US 2002/0135409 A1 Sep. 26, 2002

(51) Int. Cl.$^7$ ................................................ H03D 3/24
(52) U.S. Cl. ......................... 327/161; 327/158; 327/236
(58) Field of Search ................................. 327/236, 158, 327/156, 146, 278, 161, 276, 237, 270, 261, 159

(56) References Cited

U.S. PATENT DOCUMENTS

| 6,069,506 A | * | 5/2000 | Miller, Jr. et al. | 327/158 |
| 6,100,736 A | * | 8/2000 | Wu et al. | 327/159 |
| 6,445,231 B1 | * | 9/2002 | Baker et al. | 327/158 |
| 6,448,756 B1 | * | 9/2002 | Loughmiller | 327/158 |

* cited by examiner

Primary Examiner—Dinh T. Le
(74) Attorney, Agent, or Firm—Schwegman, Lundberg, Woessner & Kluth, P.A.

(57) ABSTRACT

A delay circuit that includes a plurality of delay cells connected in series. Each of the delay cells connects to an input node which provides a clock signal. A shift register selects one of the delay cells to allow the clock signal to enter the selected delay cell and propagate to an output node, such that internal gates of delay cells preceding the selected delay cell are not toggling.

33 Claims, 7 Drawing Sheets

METHOD FOR NOISE AND POWER REDUCTION FOR DIGITAL DELAY LINES

TECHNICAL FIELD OF THE INVENTION

The present invention relates generally to integrated circuits, and in particular to delay lines in integrated circuits.

BACKGROUND OF THE INVENTION

Digital delay lines are parts of delay locked loops, which are often used in integrated circuits (IC) to generate an internal clock signal from an external clock signal. The internal clock signal is a delayed version of the external clock signal. The internal clock signal usually has the same frequency as the external clock signal. Although they have the same frequency, the internal clock signal is preferable because it can be adapted to control internal functions of the IC easier than the external clock signal. The internal clock signal is more accurate, and matches the operating condition of the IC better than the external clock signal.

A typical digital delay line has a number of delay cells connected in series. The last delay cell in the series connects to an output node. All delay cells connect to a common input node, which receives an external clock signal. A delay cell delays the clock signal by a certain amount of delay. The internal clock signal is generated after the external clock signal is delayed by some or all of the delay cells.

Although the external clock signal is present at the inputs of all the delay cells of the delay line, the external clock signal is allowed to enter the delay line at only one entry point at one of the delay cells. The entry point of the external clock signal is usually selected by a shift register. After the external clock signal enters the delay line, it propagates from the entry point downstream to the last delay cell and to the output node of the delay line.

In a series-connected delay cells, "downstream" refers to the portion of the delay line from the entry point toward the last delay cell located at one end of the series, whereas "upstream" refers to the portion of delay line from the entry point toward the first delay cell located at the other end of the series. In a typical digital delay line, the delay cells downstream propagate the clock signal from the entry point to the output node. Thus, only the downstream delay cells apply delay to the external clock signal. The upstream delay cells are not used to propagate the external clock signal.

Although the upstream delay cells are not used, they are affected by the external clock signal. Since the external clock signal is present at the inputs of all delay cells, both downstream and upstream delay cells, the external clock signal affects the upstream delay cells by causing their internal logic gates to toggle. Since the upstream delay cells are not used, the toggling of the upstream delay cells is unnecessary. The toggling creates noise and also dissipates power unnecessarily.

Reducing the noise or power dissipation of a digital delay line would be advantageous; reducing both would be even better.

SUMMARY OF THE INVENTION

The present invention is a novel digital delay circuit having reduced noise and power dissipation.

In one aspect, the delay circuit includes an input node to receive a clock signal, an output node, and a plurality of propagation gates connected in series with one of the propagation gates connected to the output node. The delay circuit also includes a plurality of entry-point gates connected to the input node and the propagation gates. Moreover, the delay circuit includes a plurality of register cells connected to the propagation gates and the entry-point gates. The register cells select one of the entry-point gates to be an active entry-point gate to allow the clock signal to enter the active entry-point gate and propagate to the output node, such that propagation gates and entry-point gates preceding the active entry-gate are not toggling.

In another aspect, a method of reducing noise and power dissipation of a delay circuit is provided. The method includes receiving a clock signal at an input node. Next, an entry point at a delay cell among a plurality of delay cells connected in series is elected. Subsequently, from the entry point, the clock signal propagates to an output ode such that internal gates of delay cells preceding the entry point are not toggling.

DETAILED DESCRIPTION OF THE INVENTION

The following detailed description of the embodiments of the invention refers to the accompanying drawings which form a part hereof, and shows by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
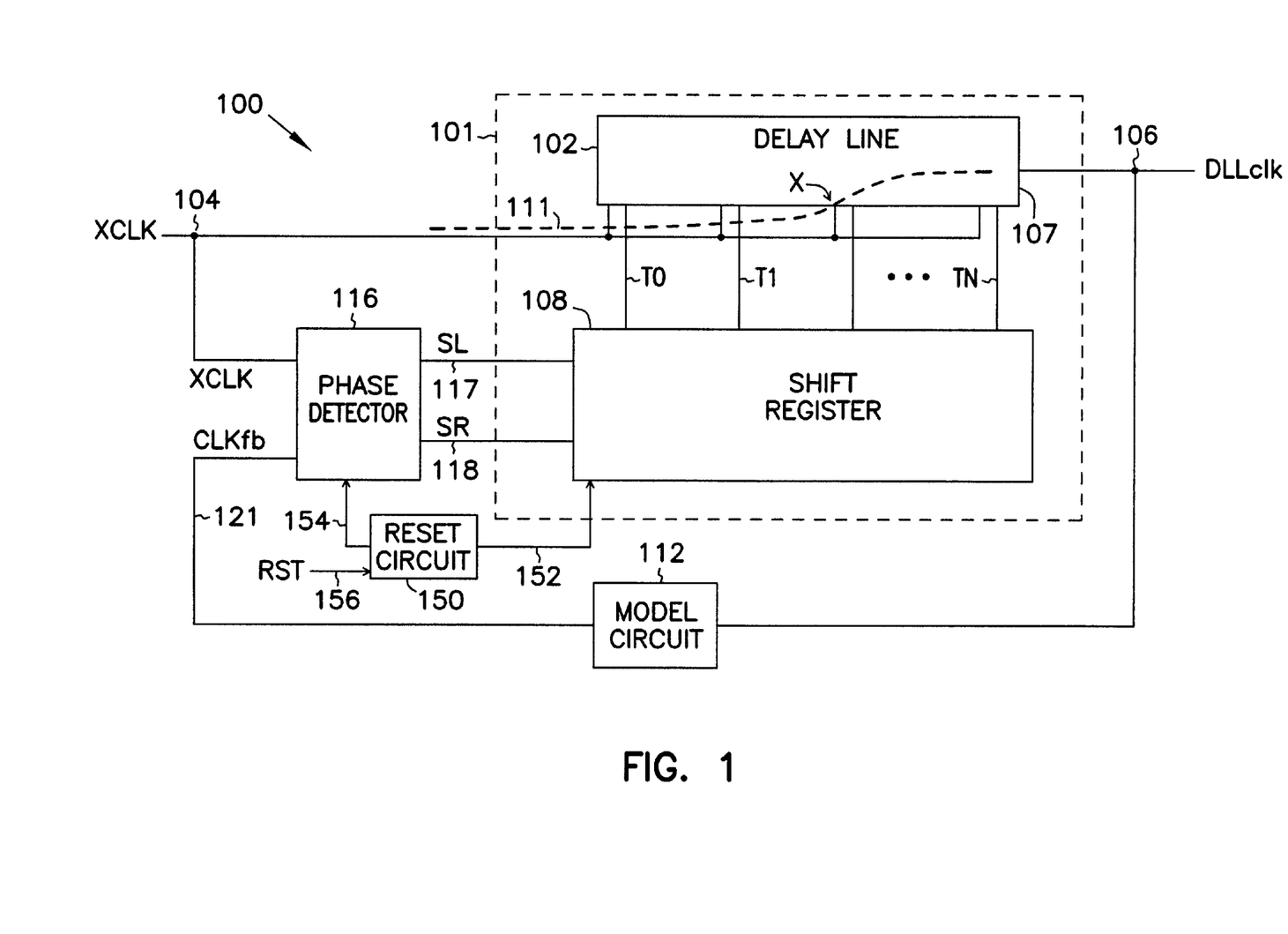
FIG. 1 illustrates a block diagram of a delay locked loop having a delay circuit according to one embodiment of the invention.

FIG. 1 illustrates a block diagram of a delay locked loop (DLL) 100 according to the invention. In the Figure, DLL 100 includes a delay circuit 101. Delay circuit 101 has a delay line 102 connected to a shift register 108 via a plurality of tap lines (T0–TN). Delay line 102 connects to an input node 104 to receive an external clock signal XCLK and produces a delayed signal or an internal clock signal (DLLclk) at an output node 106. The DLLclk signal is a delayed version of the XCLK signal. A model circuit 112 connects to output node 106 to receive DLLclk signal and produces a feedback signal CLKfb on line 121. A phase detector 116 is included in DLL 100. Phase detector 116 receives and compares the XCLK and CLKfb signals to produce shifting signals, a shift left (SL) and a shift right (SR) signal. The SL signal is provided on line 117, and the SR signal is provided on line 118. Shift register 108 receives the SL and SR signals to select one of the tap lines T0–TN. In addition, a reset circuit 150 is provided in DLL 100. Reset circuit connects to shift register 108 through line 152 and phase detector 116 via line 154. Reset circuit receives a reset signal RST provided on line 156.

In general, DLL 100 of FIG. 1 receives the external clock signal XCLK to generate the internal clock signal DLLclk. In most cases, the internal clock DLLclk has the same frequency as the external clock XCLK. However, since it is internally generated, the internal clock is more controllable. It also more accurately accounts for the variable operating condition of the device in which the DLL resides. Therefore, the internal clock is often used in place of the external clock to perform timing function within the integrated circuit.

In operation, at the beginning of an operation of DLL 100, reset circuit 150 receives the reset RST signal to reset or force shift register 108 and phase detector 116 to a predetermined initial setup or initial state. For example, reset circuit 150 can reset shift register 108 to select an initial entry point to delay line 102 at the last tap line TN. The initial entry point, however, can be anywhere between T0 and TN. From the initial entry point, shift register 108 shifts the entry point to the left; subsequently it shifts the entry point to the right or left based on the SL or SR signal received from phase detector 116. In FIG. 1, it is assumed that entry point X is the current entry point after shift register 108 has performed some shift left and shift right operations.

Delay line 102 receives, at entry point X, the external clock signal XCLK provided at input node 104. Delay line 102 applies an amount of delay to the XCLK signal when the XCLK signal propagates from entry point X through delay line 102 to output node 106. At output node 106, the XCLK signal becomes the internal clock signal DLLclk. Path 111 indicates a path in which the XCLK signal enters delay line 102 at point X and propagates to output node 106 and becomes the DLLclk signal. The position of entry point X determines the amount of delay applied to the XCLK signal. The amount of delay applied to the XCLK signal is proportional to the distance of entry point X and end point 107 of delay line 102. Thus, the closer X is to end point 107, the smaller amount of delay is applied to the XCLK signal.

Figure 2A:
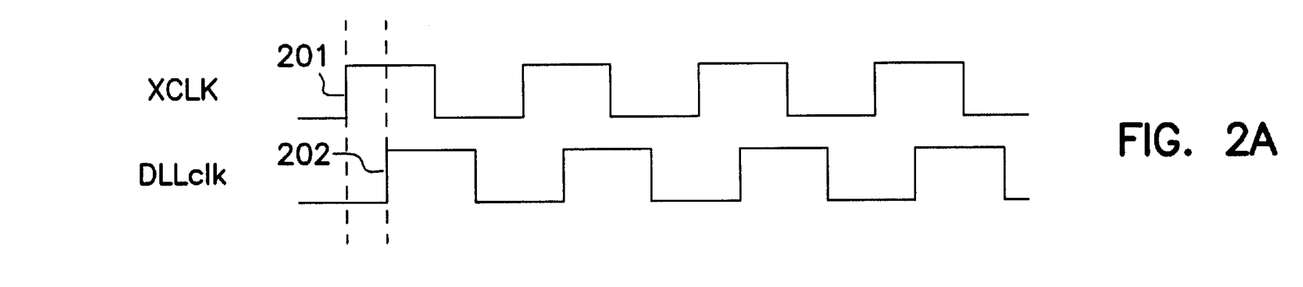
FIGS. 2A–C are exemplary timing relationships of an external clock signal and a feedback signal of the delay locked loop of FIG. 1.

Model circuit 112 receives the DLLclk signal at output node 106 and produces the feedback signal CLKfb signal. Model circuit 112 can be a replica of another circuit, which receives the same DLLclk signal for use as a timing signal. For example, model circuit 112 can be a replica of an output circuit that receives the DLLclk signal to strobe an output data signal. Model circuit 112 provides the CLKfb signal on line 121, which is fed back to phase detector 116. Phase detector 116 compares a relative timing between the edges of the XCLK and CLKfb signals and produces the shifting signals SR and SL. When the XCLK signal is leading the CLKfb, as shown in FIG. 2A edge 201 of the XCLK signal is leading edge 202 of the DLLclk signal, phase detector 116 produces a SR signal and provides it on line 117. Shift register 108 receives the SR signal and performs a shift right. When shifting right, shift register 108 selects one of the taps T0–TN to move point X to the right to decrease the amount of delay applied to the XCLK signal.

Figure 2B:
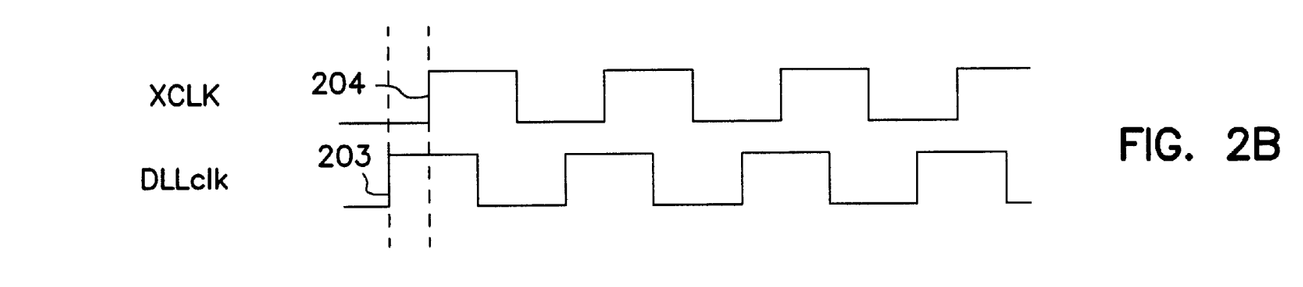
Figure 2C:
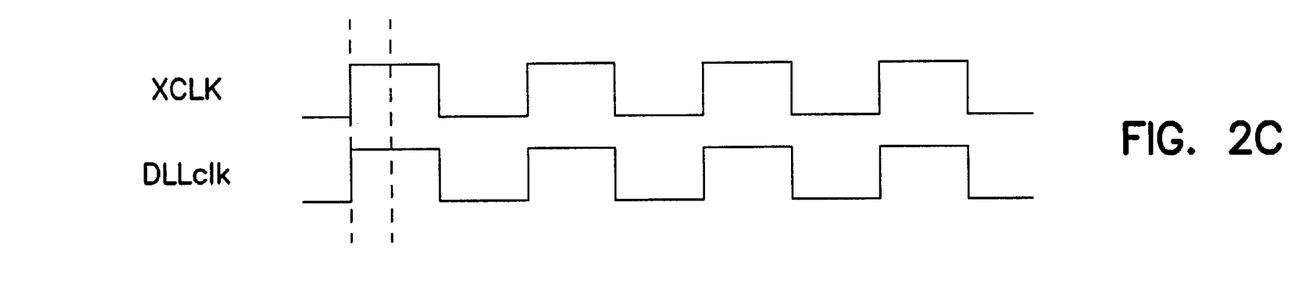

In the opposite case, when XCLK is lagging CLKfb, as shown in FIG. 2B edge 204 of the XCLK signal is lagging edge 203 of the DLLclk signal, phase detector 116 produces a SL signal and provides it on line 118. Shift register 108 receives the SL signal and performs a shift left. When shifting left, shift register 108 selects one of the taps T0–TN to move point X to the left to increase the amount of delay applied to the XCLK signal. When XCLK and CLKfb signals are substantially synchronized (as shown in FIG. 2C), phase detector 116 does not produce or active either the SR or SL signal. In other words, phase detector disables the SR and SL signals. When the SR and SL are disabled or not activated, shift register 108 stops shifting and DLL 100 is locked.

Figure 3:
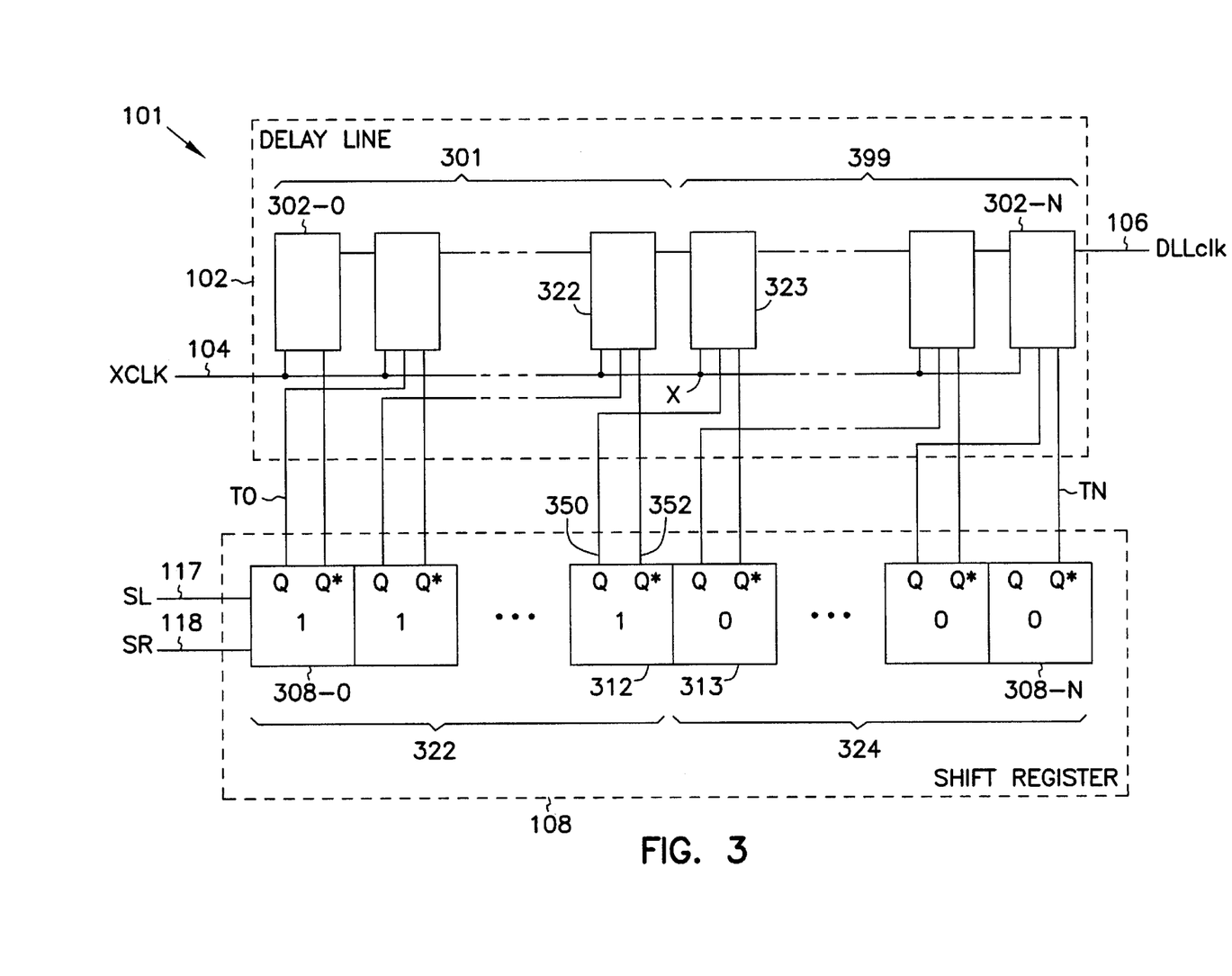
FIG. 3 shows in more detail a block diagram of the delay circuit of FIG. 1.

FIG. 3 shows in more detail a block diagram of delay circuit 101 of FIG. 1. Delay line 102 and shift register 108 are shown in more detail in this Figure. Delay line 102 has a plurality of delay cells 302 0–N. Delay cells 302 0–N are connected in series in which one of the delay cells connects to output node 106. In the Figure, delay cell 302-N connects to output node 106, which provides the DLLclk signal. Each of the delay cells 302 0–N connects to input node 104, which provides the XCLK signal.

Shift register 108 connects to delay line 102 via tap lines T0–TN. Shift register 108 has a plurality of register cells 308 0–N. Each of the register cells 308 0–N provides complementary outputs Q and Q* on lines 350 and 352. Lines 350 and 352 are two of the tap lines T0–TN. Each of the register cells 308 0–N connects to two delay cells. For example, register cell 312 connects to two delay cells 332 and 323 through lines 350 and 352.

Each of the register cells 308 0–N is capable of holding a logic value. The logic value can either be logic 1 or logic 0. For example, when output Q of register cell 312 is at a high voltage level, register cell 312 has a logic 1. When output Q of register cell 312 is at a low voltage level, register cell 312 has a logic 0. The high and low voltage levels are predetermined voltage levels according to the specification of DLL 100.

Register cells 308 0–N have consecutive logic of first value in a first group and consecutive logic of second value in a second group. The first group is adjacent to the second group. For example, in group 322, the register cells have all logic 1. In group 324, the register cells have all logic 0. Therefore, only two adjacent register cells have different logic values. For instance, adjacent register cells 312 and 313 have logic 1 and logic 0. In addition, entry point X is located at delay cell 323, which is connected to the adjacent register cells 312 and 313. In another embodiment, all but one of the register cells 308 0–N have the same logic value. Furthermore, a portion indicated by reference number 399, from point X to the last delay cell 302-N, is a downstream portion of delay line 102. A portion indicated by reference number 301, from point X to the first delay cell 302-0, is an upstream portion of delay line 102. Delay cells in upstream portion 399 are delay cells preceding entry point X.

During operation of delay circuit 101, adjacent register cells such as register cells 312 and 313 can be anywhere along shift register 108. In FIG. 3, the position of adjacent register cells 312 and 313 are only intended to be an exemplary position to illustrate the invention. Since entry point X is always selected between two adjacent cells having different logic values, the position of entry point X also can be anywhere along delay line 102.

Shift register 108 receives the SL or SR signal and selects one of the tap lines T0–TN to determine an appropriate position for entry point X. The XCLK signal enters delay line 102 at the entry point X and propagates to output node 106 and becomes signal DLLclk. In FIG. 3, entry point X is selected at a point when two of register cells 308 0–N have different logic values. In other words, when shift register 108 makes a transition from one logic value to another logic value between two of register cells 308 0–N, entry point X is selected. For example, when shift register 108 makes a transition from logic 1 to logic 0 at adjacent register cells 312 and 313, entry point X is selected at delay cell 323, which connects register cells 312 and 313.

Figure 4:
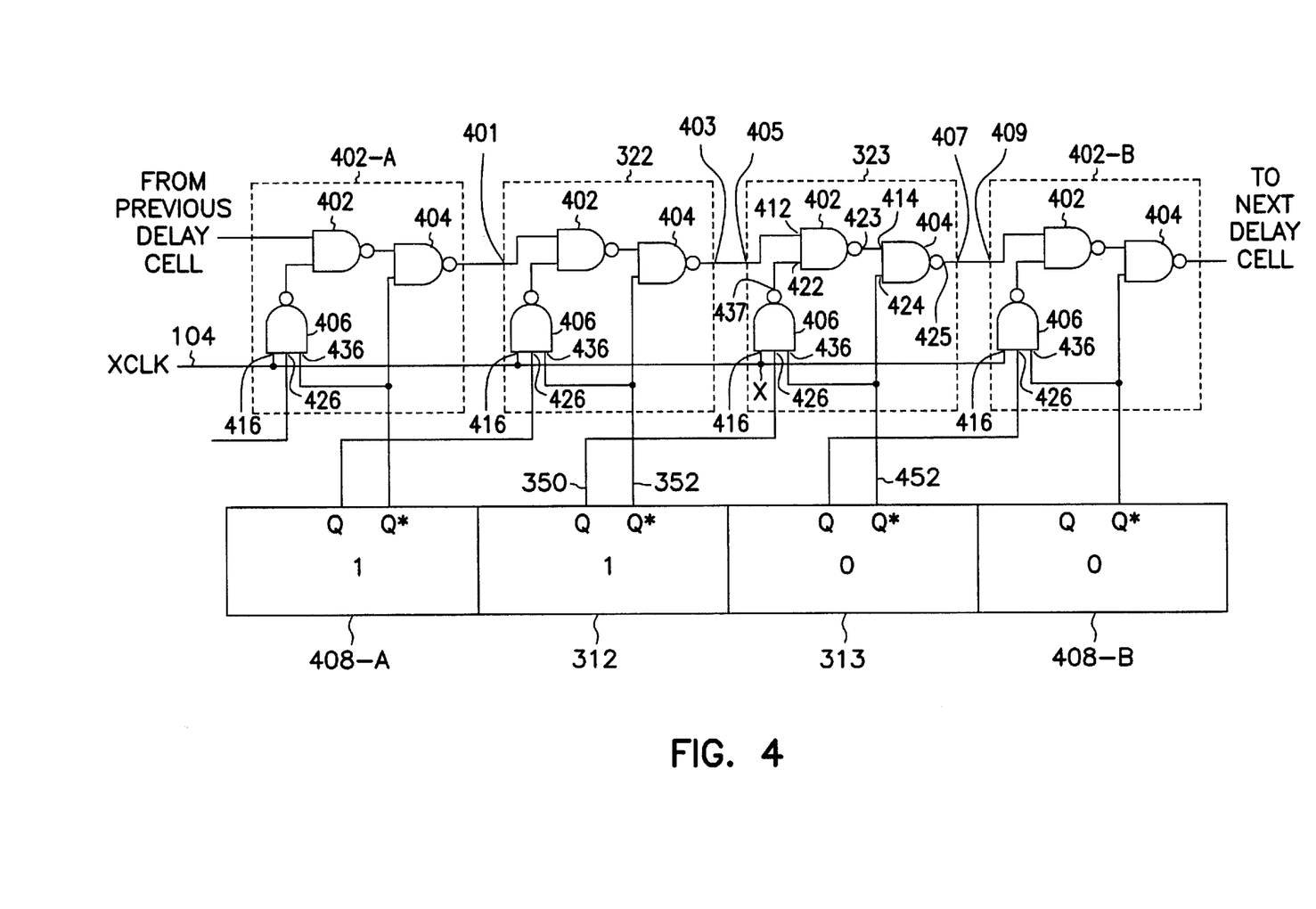
FIG. 4 is schematic diagram of a portion of the delay circuit of FIG. 3 according to one embodiment of the invention.

FIG. 4 is schematic diagram of a portion of the delay circuit 101 of FIG. 3. In FIG. 4, for simplicity, only four delay cells (402-A, 402-B, 322 and 323) and four register cells (408-A, 408-B, 312 and 313) are included. All delay cells are constructed the same. Each of delay cells has an input and an output. Delay cell 322 has an input 401 and an output 403. Delay cell 323 has an input 405 and an output 407. Delay cell 402-B has an input 409. For simplicity, not all inputs and outputs are shown in FIG. 4. The input of a delay cell connects to an output of a preceding delay cell. In other word, the output of a delay cell connects to an input of a succeeding delay cell. Thus, input 405 of delay cell 323 connects to ouput of preceding delay cell 322; and output 407 of delay cell 323 connects to input 409 of succeeding delay cell 402-B.

Each of the delay cells has a plurality of internal logic gates. For instance, delay cell 323 has logic gates 402, 404 and 406. Gates 402 and 404 are first and second propagation gates; gate 406 is an entry-point gate. Each of the propagation gates 402 and 404 have two inputs and an output. Gate 402 has two inputs 412 and 422 and output 423. Gate 404 has two inputs 414 and 424 and an output 425. Entry-point gate 406 has at least three inputs including inputs 416, 426 and 436, and an output 437. For simplicity, reference numbers of logic gates of all delay cells are referenced the same. Thus, delay cells 402-A, 402-B and 322 also have propagation gates labeled as 402 and 404 and entry-point gate labeled as 406. All logic gates of all delay cells are NAND gates.

In delay cell 323, gate 402 has input 412 connected to input 405 of delay cell 323 and output 403 of preceding delay cell 322, and input 422 connected to output 437 of gate 406, and output 423 connected to input 414 of gate 404. Gate 404 has input 424 connected to output Q* of register cell 313, and output 425 connected to output 407 of delay cell 323 and input 409 of succeeding delay cell 402-B. Gate 406 has input 416 connected to input node 104, input 436 connected to output Q* of register cell 313, and input 426 connected to output Q of register cell 312.

In FIG. 4, each of the entry-point gates connects to multiple adjacent register cells. For instance, entry-point gate 406 of delay cell 323 connects to register cell 312 through line 350 and register cell 313 via line 452. Each of the entry gates also connects to multiple propagation gates. For example, entry-point gate 406 of delay cell 323 connects to propagation gate 402 at input 422 and gate 404 at input 424. Moreover, each of the entry-point gates also connects to input node 104 at input 416 to receive the XCLK signal.

It is assumed that register cell 312 has logic value 1 and register cell has logic vale 0. It is also assumed that all register cells to the left of register cell 312 have consecutive logic 1, and all register cell to the right of register cell 313 have consecutive logic 0. Thus, only register cells 312 and 313 are adjacent register cells having different logic values. The only entry-point gate connected to two register cells having different logic values, register cells 312 and 313, is entry-point gate 406 of delay cell 323. Other entry-point gates connect to adjacent register cells having the same logic values. For instance, entry-point gate 406 of delay cell 322 connects to register cells 308-A and 312, which have the same logic value 1. Entry-point gate 406 of delay cell 402-B connects to register cells 313 and 408-B, which have the same logic value 0.

In operation, since all inputs 416 of all entry-point gates 406 connect to input node 104, the XCLK signal is present at all inputs 416 of all entry-point gates 406. However, since only one entry-point gate connects to two register cells having different logic values, only one entry-point gate is selected to be the active entry-point gate to allow the XCLK signal to enter delay line 102 and propagate to output node 106. In this case, register 108 selects entry-point gate 406 of delay cell 323 to be the active entry-point gate to allow the XCLK signal to enter entry-point 406 at point X. From point X, the XCLK signal propagates downstream and eventually to output node 106. Entry-point gate 406 of delay cell 323 is referred to as the active entry-point gate because it is the only entry-point gate having its inputs 426 and 436 connected to both high voltage level. In FIG. 4, output Q of register cell 312 and output Q* of register cell 313 are both high.

Since register cells 408-A and 312 have logic value 1, the output Q* of both register cells have logic values of 0. Since inputs 436 of entry-point gates 406 of delay cell 402-A and 322 connect to the output Q*, at least one of their inputs have a logic 0. Therefore, even though the XCLK signal is present at inputs 416 of entry-point gates 406 of delay cells 402-A and 322, entry-point gates 406 of delay cells 402-A and 322 are not toggling. Consequently, propagation gates 402 of delay cells 402-A and 322 are also not toggling because output 437 of gates 406 connect to inputs 422 of gates 402. The entry-point gates and propagation gates preceding entry-point gate 406 of delay cell 323 are also not toggling. As a result, less noise is generated and less power is dissipated.

In summary, only one active entry-point gate is selected by shift register 108 when shift register 108 has a transition from one logic value to another logic value in two adjacent register cells. The active entry-point gate allows the XCLK signal to enter delay line 102 and propagate to output node 106. Entry-point gates and propagation gates preceding the selected or active entry-point are not active or toggling. The entry-point gates and propagation gates preceding the active entry-point gate refer to the upstream entry-point gates and propagation gates. When the upstream entry-point gates and propagation gates are not active or toggling, noise is reduced and local power dissipation from the gates is also reduced.

Figure 5:
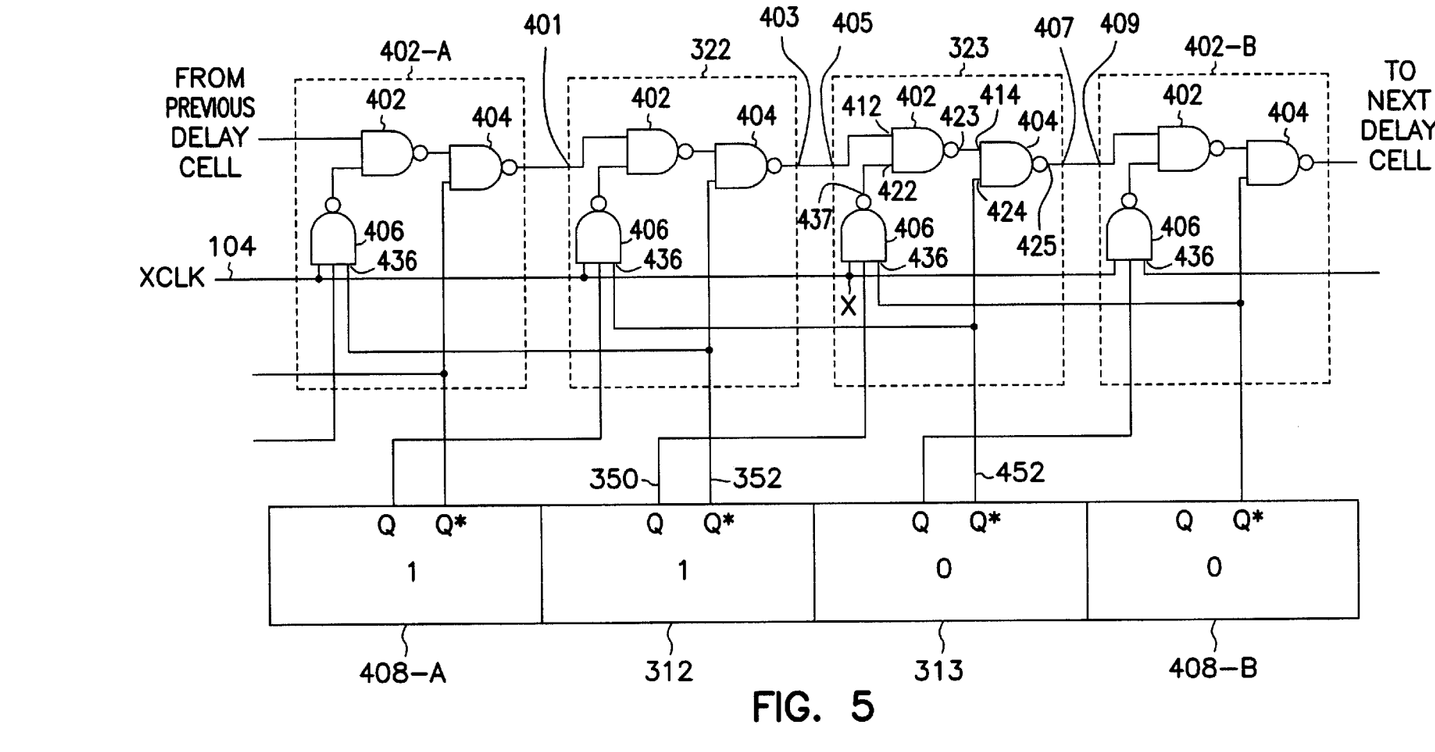
FIG. 5 is schematic diagram of a portion of the delay circuit of FIG. 3 according to another embodiment of the invention.

FIG. 5 is a schematic diagram of a portion of the delay circuit of FIG. 3 according to another embodiment of the invention. The elements of the schematic diagram of FIG. 5 is the same as the elements of the schematic diagram of FIG. 4 except the connection of input 436 of entry-point gate 406. In FIG. 4, input 436 of entry-point gate 406 of one delay cell connects to input 424 of propagation gate 404 of the same delay cell. In FIG. 5, input 436 of entry-point gate 406 of one delay cell connects to input 424 of propagation gate 404 of another delay cell. Furthermore, since input 424 connects to output Q* of a register cell, input 436 also connects to the same output Q* of the same register cell. For example, input 436 of entry-point gate 406 of delay cell 322 connects to input 424 of propagation gate 404 of delay cell 323. Input 436 also connects to output Q* of register cell 313.

The delay circuit of FIG. 5 operates in the same fashion as the delay circuit of FIG. 4 with one exception. In FIG. 5, internal gates of one delay cell preceding the active entry-point gate are toggling when the register cells have a shift left. The toggling occurs because the entry-point gate of one delay cell connects to two non-adjacent register cells and to propagation gate of another delay cell. For example, if entry-point gate 406 of delay cell 323 is the active entry-point gate when the register cells perform a shift left, then only gates 406 and 404 of the preceding delay cell 322 are toggling. The other entry-point gates and propagation gates of other delay cell preceding delay cells 322 are not toggling.

Both delay circuits shown in FIG. 4 and FIG. 5 can be used in a digital delay line where only the rising edge of the output signal at node 106 is used. However, the delay circuit of FIG. 5 is preferred over the delay circuit of FIG. 4 if both rising and falling edges of the output signal at node 106 are used. This is because the circuit of FIG. 4 can cause a duty-cycle error on the falling edge of the output signal at node 106. However, the error only occurs with a shift left operation and only lasts for one cycle. The delay circuit of FIG. 5 has no duty-cycle error.

Figure 6:
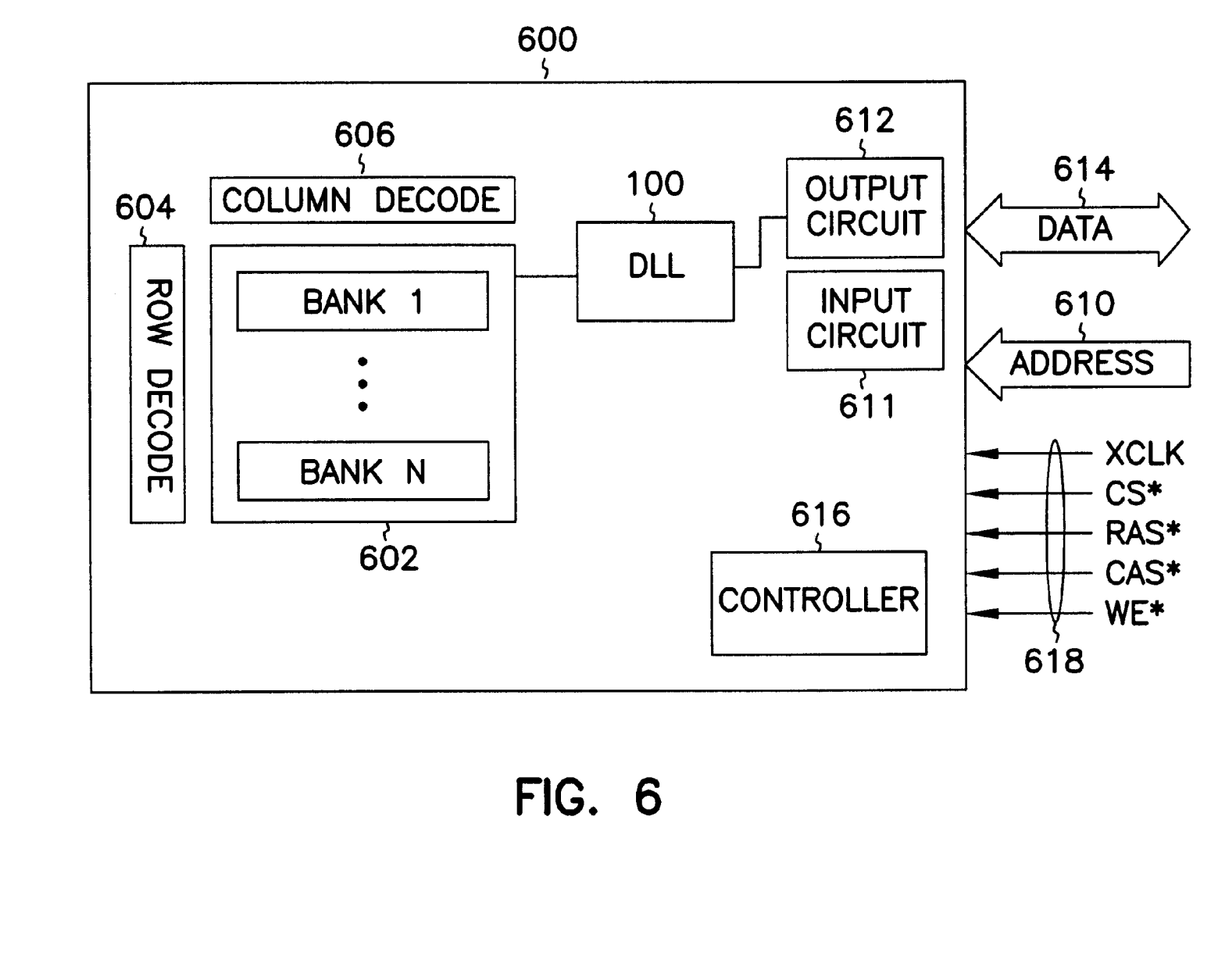
FIG. 6 is a block diagram of a memory device having the delay locked loop of FIG. 1.

FIG. 6 is a simplified block diagram of a memory device 600 according to one embodiment of the invention. In one embodiment, memory device 600 includes a main memory 602. Main memory 602 typically includes dynamic random access memory (DRAM) devices which include one or more memory banks, indicated by BANK 1–N. Each of the memory banks BANK 1–N includes a plurality of memory cells arranged in rows and columns. Row decode 604 and column decode 606 access individual memory cells in the rows and columns in response to an address, provided on address bus or address lines 610 (ADDRESS). An input circuit 611 and an output circuit 612 connect to a data bus 614 (DATA) for bi-directional data communication with main memory 602. A memory controller 616 controls memory 600 responding to control signals provided on control lines 618. The control signals include, but are not limited to, an input clock signal (XCLK), Chip Select (CS*), Row Access Strobe (RAS*), Column Access Strobe (CAS*), Write Enable (WE*).

It will be appreciated by those skilled in the art that the memory device 600 of FIG. 6 can include additional circuitry and control signals, and that memory device 600 of FIG. 6 has been simplified to help focus on the invention. According to the invention memory device 610 further includes a DLL 100. The construction and operation of DLL 100 are described in detail in connection with FIGS. 1–4. DLL 100 of memory device 100 can be used to strobe output data read from main memory 602 to output circuit 612 during a memory read operation. DLL 100 can also be used in other functions of memory device 600 in which a clock timing is required.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

Figure 7:
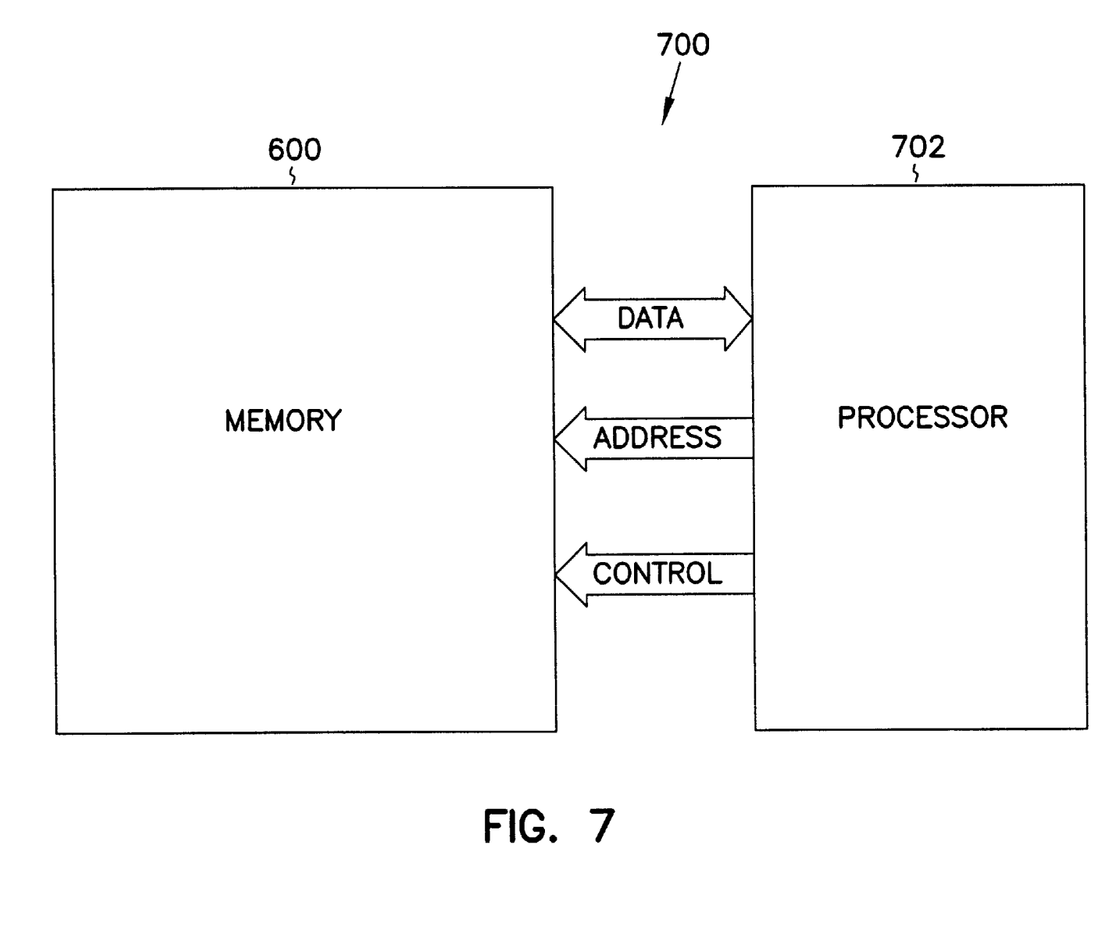
FIG. 7 illustrates a system according to the invention.

FIG. 7 illustrates a system according to the invention. In the Figure, system 700 includes a processor 702 connected to a memory device 600. Memory device 600 includes DLL 100 of the invention described above in FIGS. 1–5. According to the invention, processor 702 provides control signals to memory device 600 via control lines (CONTROL). Data communication between the processor and the memory is transmitted via data lines or a data bus (DATA), and addresses are provided to the memory via address lines or address bus (ADDRESS). In one embodiment, processor 702 and memory device can be fabricated on a single chip.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A delay circuit comprising:
   an input node to receive a clock signal, and an output node;
   a plurality of propagation gates connected in series, one of the propagation gates connected to the output node;
   a plurality of entry-point gates connected to the input node, each of the entry points gates being connected to more than one of the propagation gates; and
   a plurality of register cells, wherein each of the register cells connects to one of the propagation gates and more than one of the entry-point gates for selecting one of the entry-point gates to be an active entry-point gate to allow the clock signal to enter the active entry-point gate and propagate to the output node, such that propagation gates and entry-point gates preceding the active entry-gate are not toggling.

2. The delay circuit of claim 1, wherein each of the entry-point gates connects to two propagation gates.

3. The delay circuit of claim 1, wherein each of the entry-point gates connects to two register cells.

4. The delay circuit of claim 1, wherein each of the entry-point gates includes at least three inputs.

5. The delay circuit of claim 1, wherein each of the entry-point gates is a NAND gate.

6. The delay circuit of claim 1, wherein each of the entry-point gates is a three-input NAND gate.

7. A delay circuit comprising:
   an input node to receive a clock signal, and an output node;
   a plurality of propagation gates connected in series, one of the propagation gates connected to the output node;
   a plurality of entry-point gates connected to the input node, each of the entry points gates being connected to more than one of the propagation gates; and
   a plurality of register cells, each having a logic value, wherein each of the register cells connects to one of the propagation gates and more than one of the entry-point gates for selecting one of the entry-point gates to be an active entry-point gate to allow the clock signal to enter the active entry-point gate and propagate to the output node, wherein each of the entry-point gates connects to multiple register cells, wherein the active entry-point gate connects to multiple register cells having different logic values.

8. The delay circuit of claim 7, wherein the active entry-point connects to two register cells, wherein one of the register cells has logic 1 and the other register cell has logic 0.

9. The delay circuit of claim 7, wherein each of the entry-point gates connects to two propagation gates.

10. The delay circuit of claim 7, wherein each of the entry-point gates includes at least three inputs.

11. The delay circuit of claim 7, wherein each of the entry-point gates is a NAND gate.

12. The delay circuit of claim 7, wherein each of the entry-point gates is a three-input NAND gate.

13. A delay circuit comprising:
   an input node to receive a clock signal, and an output node;
   a plurality of propagation gates connected in series, one of the propagation gates connected to the output node;
   a plurality of entry-point gates connected to the input node, each of the entry points gates being connected to more than one of the propagation gates; and
   a plurality of register cells, each having a logic value, wherein each of the register cells connects to one of the propagation gates and more than one of the entry-point gates for selecting one of the entry-point gates to be an active entry-point gate to allow the clock signal to enter the active entry-point gate and propagate to the output node, wherein each of the entry-point gates connects to more than one of the propagation gates and more than one of the register cells.

14. The delay circuit of claim 13, wherein each of the entry-point gates connects to two propagation gate and two register cells.

15. The delay circuit of claim 13, wherein each of the entry-point gates is a three-input NAND gate.

16. The delay circuit of claim 13, wherein each of the entry-point gates includes a first input, a second input, a third input, and an output, the first input connecting to the input node, the second input connecting to a first propagation gate and a first register cell, the third input connecting to a second propagation gate and a second register cell, and the output connecting the first propagation gate.

17. The delay circuit of claim 16, wherein an output of the first propagation gate connects to an input of the second propagation gate, wherein the third input of the entry-point gate connects to another input of the second propagation gate, wherein the output of the entry-point gate connects to an input of the first propagation gate.

18. A delay circuit comprising:
   an input node;
   a plurality of register cells; and
   a plurality of delay cells, each of the delay cells having an input and an output, each of the delay cells comprising:
      a first propagation gate having a first input, a second inputs, and an output, the first input connecting to an output of a preceding delay cell;
      a second propagation gate having an input connected to the output of the first propagation gate and another input connected to a first register cell, and an output connected to the input of a succeeding delay cell; and
      an entry-point gate having a first input, a second input, a third input, and an output, the output connecting to the second input of the first propagation gate, the first input connecting to the input node, the second input connecting to the first register cell, and the third input connecting to a second register cell.

19. The delay circuit of claim 18, wherein the entry-point gate is a NAND gate.

20. The delay circuit of claim 18, wherein the first and second propagation gates are NAND gates.

21. A delay circuit comprising:
   an input node;
   a plurality of register cells; and
   a plurality of delay cells, each of the delay cells having an input and an output, each of the delay cells comprising:
      a first propagation gate having a first input, a second input, and an output, the first input connecting to an output of a preceding delay cell;
      a second propagation gate having an input connected to the output of the first propagation gate and another input connected to a first register cell, and an output connected to the input of a succeeding delay cell; and
      an entry-point gate having a first input, a second input, a third input, and an output, the output connecting to the second input of the first propagation gate, the first input connecting to the input node, the second input connecting to a second register cell, and the third input connecting to a third register cell.

22. The delay circuit of claim 21, wherein the entry-point gate is a NAND gate.

23. The delay circuit of claim 21, wherein the first and second propagation gates are NAND gates.

24. A delay lock loop comprising:
   an input node to receive a clock signal;
   a phase detector connected to the input node;
   a shift register connected to the phase detector; and
   a delay line connected to the input node and the shift register, the delay line comprising:
      a plurality of propagation gates connected in series, one of the propagation gates connected to an output node; and
      a plurality of entry-point gates connected to the input node, each of the entry-point gates being connected to more than one of the propagation gates, wherein one of the entry-point gates is selected by the shift register to be an active entry-point gate to allow the clock signal to propagate from the active entry-point gate to an output node, such that propagation gates and entry-point gates preceding the active entry-point gate are not toggling.

25. The delay lock loop of claim 24, wherein each of the entry-point gates connects to multiple propagation gates.

26. The delay lock loop of claim 24, wherein each of the entry-point gates connects to multiple register cells.

27. The delay lock loop of claim 24, wherein each of the entry-point gates connects to multiple propagation gates and multiple register cells.

28. The delay circuit of claim 24, wherein each of the entry-point gates includes at least three inputs.

29. The delay circuit of claim 24, wherein each of the entry-point gates is a three-input NAND gate.

30. A memory device comprising:
   a main memory;
   an output circuit; and
   a delay locked loop connected between the main memory and the output circuit,
   the delay locked loop comprising:
      an input node to receive a clock signal;
      a phase detector connected to the input node;
   a shift register connected to the phase detector; and
   a delay line connected to the input node and the shift register, the delay line comprising:
      a plurality of propagation gates connected in series, one of the propagation gates connected to an output node; and
      a plurality of entry-point gates connected to the input node, each of the entry-point gates being connected to more than one of the propagation gates, wherein one of the entry-point gates is selected by the shift register to be an active entry-point gate to allow the clock signal to propagate from the active entry-point gate to an output node, such that propagation gates and entry-gate preceding the active entry-gate are not toggling.

31. A system comprising:

a processor; and a memory device connected to the processor, the memory device comprising:
   a main memory;
   an output circuit; and
   a delay locked loop connected between the main memory and the output circuit, the delay locked loop comprising:
      an input node to receive a clock signal;
      a phase detector connected to the input node;
      a shift register connected to the phase detector; and
      a delay line connected to the input node and the shift register, the delay line comprising:
         a plurality of propagation gates connected in series, one of the propagation gates connected to an output node; and
         a plurality of entry-point gates connected to the input node, each of the entry-point gates being connected to more than one of the propagation gates, wherein one of the entry-point gates is selected by the shift register to be an active entry-point gate to allow the clock signal to propagate from the active entry-point gate to an output node, such that propagation gates and entry-gate preceding the active entry-gate are not toggling.

32. A method of reducing noise and power dissipation of a delay line, the method comprising:

receiving a clock signal;

selecting an entry point at a delay cell among a plurality of delay cells connected in series; and propagating the clock signal from the entry point to an output node such that internal gates of delay cells preceding the entry point are not toggling.

33. A method of reducing noise and power dissipation of a delay line, the method comprising:

receiving a clock signal;

selecting an entry-point gate among a plurality of entry-point gates to be an active entry-point gate; and propagating the clock signal from the active entry-point gate through a portion of series-connected propagation gates to an output node such that entry-point gates and propagation gates preceding the active entry-point gate are not toggling.

* * * * *